United States Patent
Geyer

(10) Patent No.: US 7,339,248 B2
(45) Date of Patent: Mar. 4, 2008

(54) SELF-ADJUSTING SERIAL CIRCUIT OF THIN LAYERS AND METHOD FOR PRODUCTION THEREOF

(75) Inventor: Volker Geyer, Niederkruchten (DE)

(73) Assignee: Scheuten Glasgroep (NL)

(*) Notice: Subject to any disclaimer, the term of this patent is extended or adjusted under 35 U.S.C. 154(b) by 272 days.

(21) Appl. No.: 10/508,194

(22) PCT Filed: Mar. 18, 2003

(86) PCT No.: PCT/EP03/02864

§ 371 (c)(1),
(2), (4) Date: Jun. 27, 2005

(87) PCT Pub. No.: WO03/079448

PCT Pub. Date: Sep. 25, 2003

(65) Prior Publication Data

US 2006/0110860 A1    May 25, 2006

(30) Foreign Application Priority Data

Mar. 19, 2002  (EP) ................... 02006126

(51) Int. Cl.
  *H01L 21/283* (2006.01)
  *H01L 27/142* (2006.01)
(52) U.S. Cl. ............... 257/448; 257/461; 257/E31.124; 257/E37.125; 438/63; 438/80; 438/98; 438/763; 438/944
(58) Field of Classification Search ........... 438/63, 438/80, 98, 763, 944; 257/448, 461, E31.124, 257/E37.125
See application file for complete search history.

(56) References Cited

U.S. PATENT DOCUMENTS

| | | | | |
|---|---|---|---|---|
| 4,065,781 A * | 12/1977 | Gutknecht | .................... | 257/66 |
| 4,529,686 A * | 7/1985 | Kraus | ........................ | 430/314 |
| 4,633,284 A * | 12/1986 | Hansell et al. | ................. | 257/58 |
| 4,679,311 A * | 7/1987 | Lakhani et al. | ............. | 438/471 |
| 5,294,869 A * | 3/1994 | Tang et al. | .................. | 313/504 |
| 5,294,870 A * | 3/1994 | Tang et al. | .................. | 313/504 |
| 6,313,905 B1 * | 11/2001 | Brugger et al. | ............... | 355/55 |
| 6,384,529 B2 * | 5/2002 | Tang et al. | .................. | 313/506 |
| 6,672,215 B2 * | 1/2004 | Daoud | .................... | 102/202.14 |
| 2002/0011785 A1 * | 1/2002 | Tang et al. | .................. | 313/506 |
| 2002/0195929 A1 * | 12/2002 | Haase et al. | ................. | 313/504 |
| 2003/0124245 A1 * | 7/2003 | Sakaguchi | .................... | 427/66 |
| 2003/0207505 A1 * | 11/2003 | Theiss et al. | ............... | 438/158 |
| 2004/0217699 A1 * | 11/2004 | Haase et al. | ................. | 313/504 |
| 2005/0066897 A1 * | 3/2005 | Pelhos et al. | ............... | 118/721 |
| 2005/0214577 A1 * | 9/2005 | Sakamoto et al. | .......... | 428/690 |
| 2005/0264931 A1 * | 12/2005 | McFadyen | .................. | 360/126 |

FOREIGN PATENT DOCUMENTS

JP          61 035573 A       2/1986
WO       WO 96/30935 A     10/1996

* cited by examiner

*Primary Examiner*—George Fourson
(74) *Attorney, Agent, or Firm*—Richard Aron Osman

(57) ABSTRACT

The invention relates to a self-adjusting serial connection of thin layers and a method for the production thereof. The invention is characterized in that electrically conducting conductor tracks (20) are applied to a substrate (10), whereupon several main deposit layers (30, 40, 50) of conducting, semi-conducting or insulating materials are applied to the substrate. The application of the layers is carried out at various angles of incidence to the surface of the substrate.

21 Claims, 5 Drawing Sheets

SELF-ADJUSTING SERIAL CIRCUIT OF THIN LAYERS AND METHOD FOR PRODUCTION THEREOF

FIELD OF THE INVENTION

The invention relates to a self-adjusting serial connection of thin layers and a method for the production thereof.

BACKGROUND OF THE INVENTION

In industry, there is an increasing need for methods for the production of series connections of thin layers, but especially in the realm of thin-layer photovoltaics, the problem of serial connection of thin-layer cells has not yet been solved satisfactorily.

The best-known method for the production of serial connections of thin layers is the application of the individual layers, interrupted by process steps in which the applied layer is separated by a laser or by mechanical means. Typically, several processing steps are needed for this in which each applied layer is provided with interruptions in the form of separating cuts.

Such production methods have various disadvantages. Since the cuts, in order to minimize dead surfaces, have to lie very close to each other but must not overlap or intersect with each other because this would otherwise cause short circuits or errors, an extremely precise orientation of the substrate, for example, is necessary. Moreover, in order to effectuate an inline process, an appropriate station has to be set up for each cut that is to be made. In contrast, if the method is not carried out in an inline process, then the substrate has to be transported to a cutting station for each cut.

International patent application WO 96/30935 discloses a method for the production of multilayer electronic components with which electrically conductive and insulating layers are applied alternately. Here, a substrate is used on whose surface there are webs having a rectangular cross section so that an oriented layer deposition at an incident angle causes a shading of areas between the webs.

SUMMARY OF THE INVENTION

The objective of the invention is to refine a method of the generic type for the production of self-adjusting serial connections of thin layers in such a way as to avoid the drawbacks of conventional production methods and to have just a few process steps that are easy to carry out.

Moreover, it is the objective of the invention to provide a self-adjusting serial connection of thin layers that can be produced by just a few process steps that are easy to carry out.

According to the invention, this objective is achieved in that electrically conductive conductor tracks are applied onto a substrate and the substrate is exposed to several layer depositions of conductive, semiconductive and/or insulating materials that are applied at different angles of incidence.

At the various angles, different areas between the conductor tracks are shaded and are thus not exposed to the material deposition in question, so that a layer structure is obtained that forms serially connected thin layers through which a current can flow.

The applied conductor tracks preferably have a rectangular cross section, but other cross section geometries are also possible. For example, the conductor tracks can have a triangular, trapezoidal or round cross section. The conductor tracks are applied onto the surface of a substrate. After the application of the conductor tracks, the substrate is consecutively exposed to various layer depositions, whereby the individual depositions are carried out at different angles of incidence. The direction of the deposition in question is preferably perpendicular to the lengthwise orientation of the conductor tracks and at an angle relative to the surface of the substrate so that, between the conductor tracks, areas are formed that are shaded by the conductor track flanks and that are thus not exposed to deposition.

In an especially preferred embodiment of the invention, in order to create a serial connection of thin layers, three main deposition layers that are made of different materials are applied at different angles. These main layers can, in turn, consist of several individual layers that are preferably applied at the same angle as the main layer. The method according to the invention, however, can also be used to produce serial connections with more than three main layers, or else the main layers are augmented by additional layers and/or processing procedures.

An especially preferred embodiment of a serial connection consisting of three main layers will be described below. The first main deposition layer is preferably a back contact made of a conductive or semiconductive material. This first deposition at a first angle of incidence $\alpha$ creates a coating of the substrate, of a flank and of the top of a conductor track, whereby a certain area behind the conductor tracks is not coated with the conductive or semiconductive material. At a certain distance behind the conductor tracks, a coating of the substrate is carried out once again, continuing on the flank of the next conductor track. Consequently, the selection of the angle of incidence of the deposition depends on the requisite area behind the conductor tracks that is not to be coated.

The second main layer is preferably a semiconductor. It has proven to be advantageous for this second layer deposition to be carried out at an angle $\beta$ of 90° relative to the surface of the substrate so that now the tops of the conductor tracks and the areas between the conductor tracks are completely coated. If the second deposition is carried out at an angle different from 90° relative to the surface of the substrate, then flank sides of the conductor tracks are also coated. This has to be avoided for a serial connection of the layers since the layer of the front contact, which is to be applied later, must not touch the back contact, and a connection via the coating of the flanks would cause a short circuit. However, if the flanks are nevertheless coated, then they have to be cleaned before the application of the front contact.

A third deposition is carried out, in turn, at an angle of incidence $\gamma$ that is inverse to the first angle $\alpha$, and this layer is preferably an electrically transparent front contact made of a conductive or semiconductive material.

The different layers can also consist of several individual layers that are advantageously each applied at the same angle as the main layer. In particular, the second semiconductor layer can be formed by individual layers in conjunction with additional process steps.

The described repetition of layer depositions at different angles gives rise to a serial connection of thin layers that is especially well-suited for use in solar cells.

It has proven to be especially advantageous to carry out the layer depositions by means of a PVD method and to sputter on the layer particles. However, other coating methods such as spraying or CVD methods can also be used.

The described method for the production of self-adjusting serial connections of thin layers is characterized by a number of advantages in comparison to conventional methods. For one thing, there is no need for an absolutely precise orientation of the substrate to be coated since the shading area determines the separation areas. Secondly, by using suitable application means, the shading width and thus the non-active area can be reduced to a minimum. Moreover, the method can readily be carried out in an inline process since the substrate does not have to be transported back and forth between individual processing stations but rather can be processed at one single station with suitable application means. It is not possible for the separation areas to cross, so that error sources and short circuits are ruled out.

Additional advantages, special features and advantageous refinements of the invention ensue from the subordinate claims and from the presentation below of preferred embodiments with reference to the figures.

DETAILED DESCRIPTION OF EMBODIMENTS OF THE INVENTION

Figure 1:
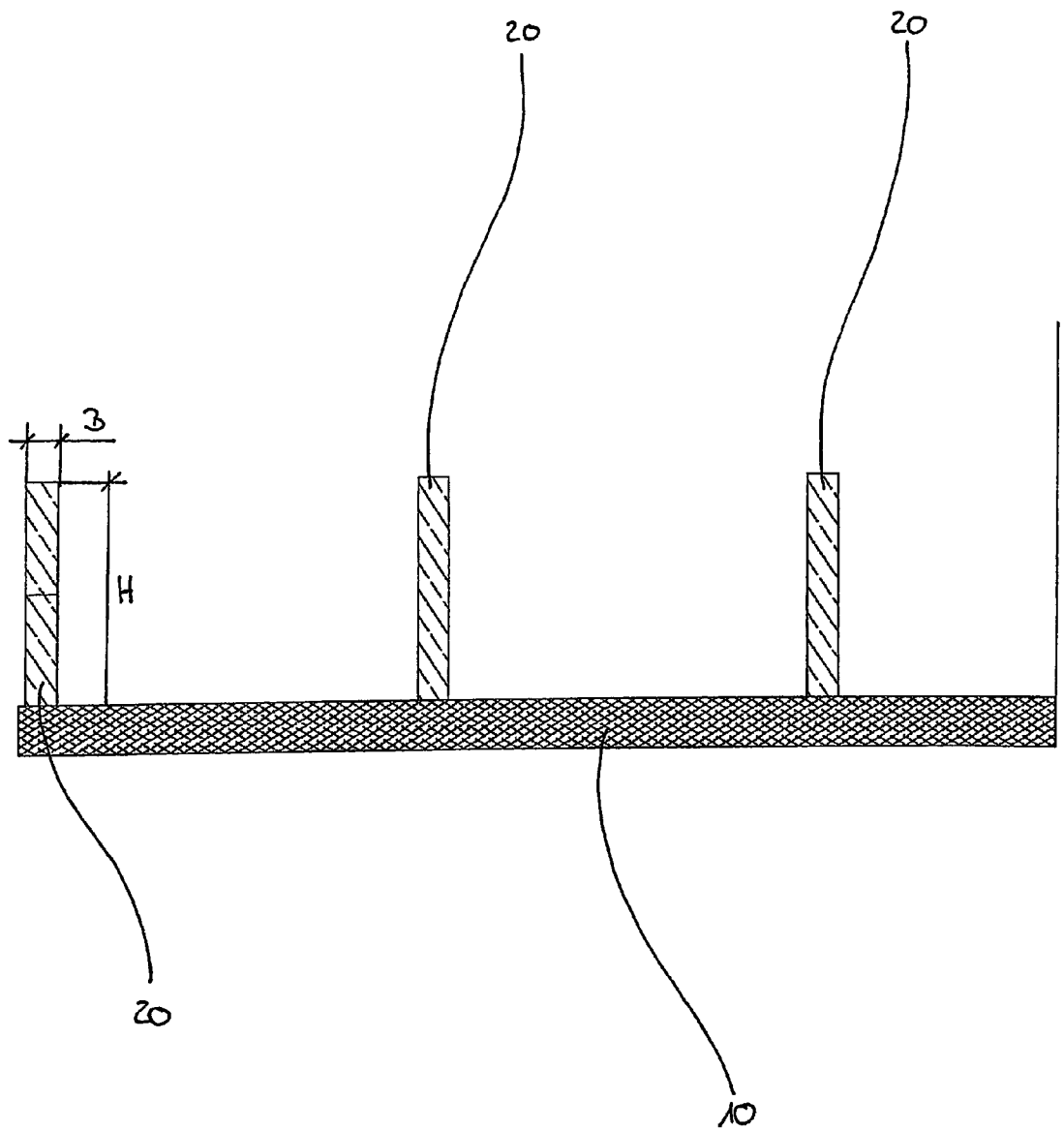
FIG. 1 an embodiment of a substrate with applied conductor tracks.

FIG. 1 shows a substrate 10 onto which several conductor tracks 20 running essentially parallel to each other were applied. Here, the expression "essentially" also encompasses conductor tracks that run exactly parallel as well as conductor tracks that diverge from the parallel by up to 50% of the distance between the conductor tracks. The substrate can be, for example, glass, especially float glass. Another suitable substrate is polymer film. The conductor tracks 20 are electrically conductive and can be made of conductive polymer compounds, conductive glass frits, metallic strips or other materials. The cross section of the conductor tracks is preferably rectangular, but other cross sections can also be chosen. For example, the conductor tracks can have a triangular, trapezoidal or round cross section. The triangular conductor tracks can be applied in such a way that a side surface is joined to the surface of the substrate. Trapezoidal conductor tracks are advantageously applied in such a way that the cross section tapers towards the surface of the substrate.

The conductor tracks can be applied, for example, by means of silk screen printing, whereby the width W of the tracks is determined by the screen and by the properties of the paste employed, whereas the height H is determined primarily by the number of printing procedures. The silk screen printing can be carried out, for example, with graphite and/or silver paste. The resulting dimensions of the conductor tracks are advantageously in the following orders of magnitude: width W=10 µm to 500 µm and height H=5 µm to 500 µm. The length of the conductor tracks can likewise be selected as desired and depends primarily on the dimensions of the substrate to be coated. Typical applications use conductor tracks with lengths L in the order of magnitude of 30 cm to 6 meters. Therefore, the number of applied conductor tracks can be selected as desired, whereby it preferably lies in the range from 50 to 200 per meter. The distance between the individual conductor tracks 20 is established as a function of the selected dimensions.

Figure 2:
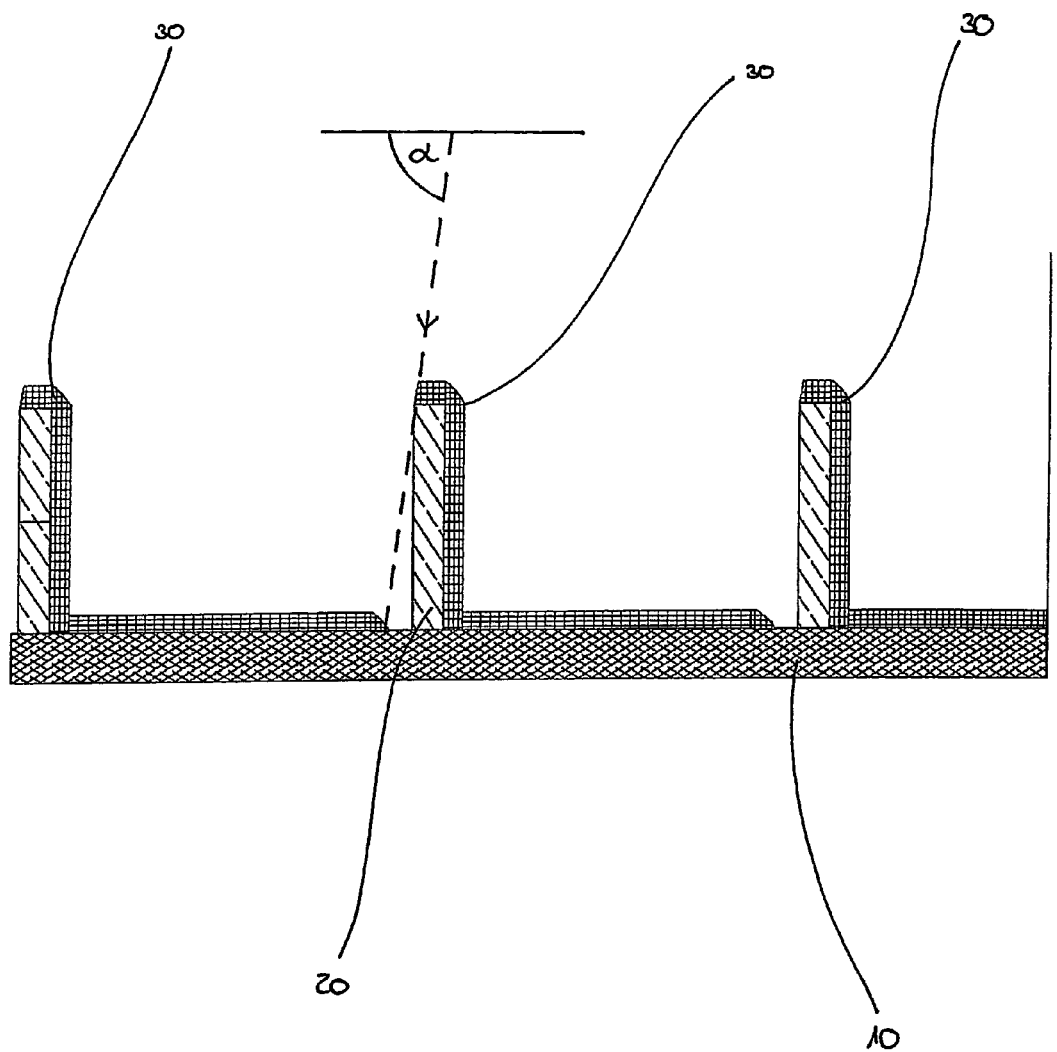
FIG. 2 the application of a first layer at an angle of incidence α.

FIG. 2 shows an embodiment in which a first main layer 30 is applied onto the substrate 10 and onto the conductor tracks 20 by the process according to the invention. This first layer deposition is carried out at a first angle of incidence α relative to the surface of the substrate and advantageously perpendicular to the lengthwise orientation of the conductor tracks 20. The angle between the lengthwise orientation of the conductor tracks and the direction of the deposition, however, can also diverge from 90°. Here, angles between 90° and 1° are possible.

The drawing in FIG. 2 shows that, due to the coating at an angle relative to the surface of the substrate, shaded areas are formed behind the conductor tracks and these areas are thus not exposed to any deposition. Therefore, a coating is created on the tops and on the flanks of the conductor tracks that are exposed to deposition, as well as on the areas between the conductor tracks that do not lie in the shadow of the conductor tracks. The thickness of the first thin layer applied in this way is typically in the order of magnitude of 50 nm to 50 µm.

In an especially preferred embodiment, this first layer is a back contact whose main constituent is molybdenum. However, the back contact layer can also be made of other materials such as conductive adhesives, silver or TCOs (transparent conductive oxides) such as ZnO:Al or indium-doped tin oxide (ITO).

Figure 3:
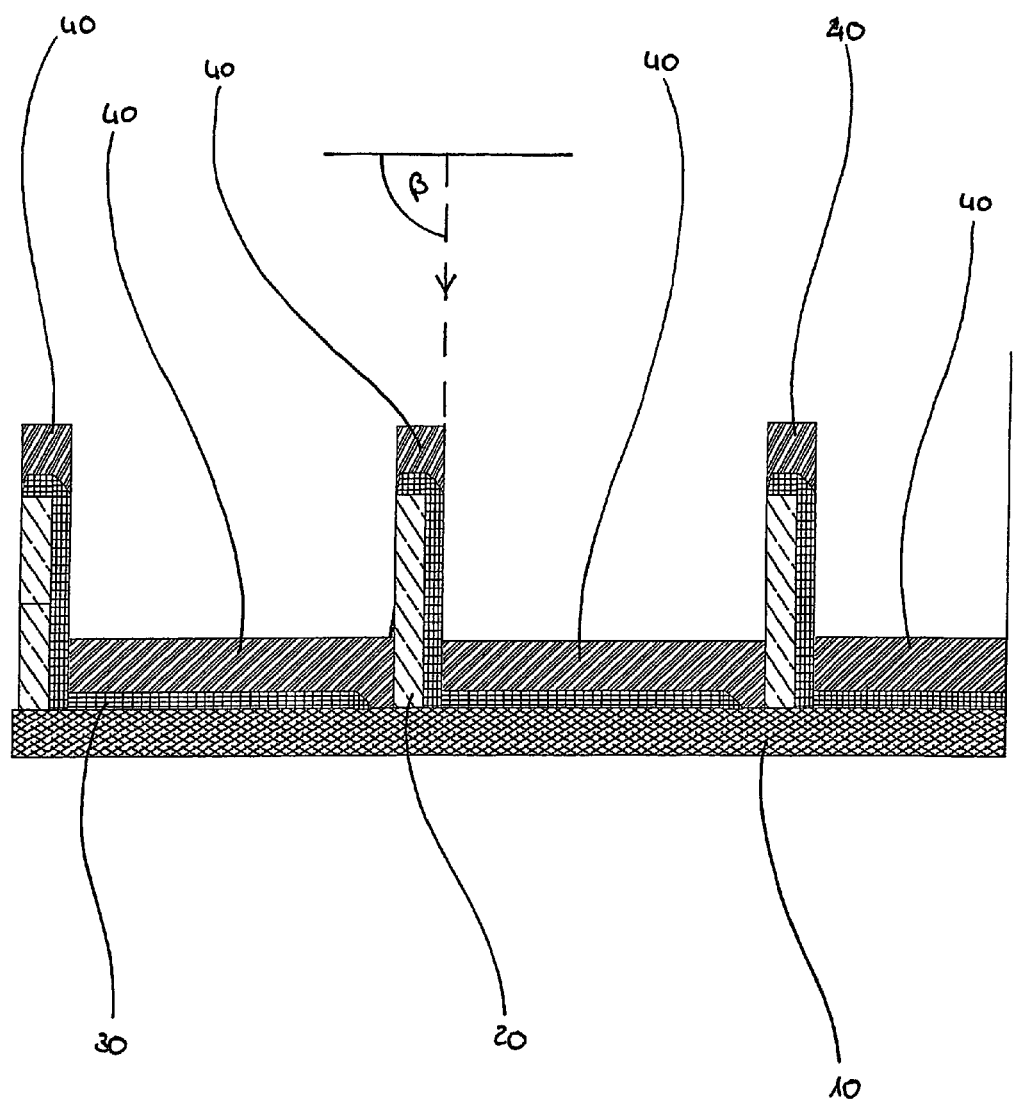
FIG. 3 the application of a second layer at an angle of incidence β.

The drawing in FIG. 3 shows how a second main layer 40 is applied onto the substrate 10 and onto the conductor tracks 20. This layer deposition is preferably carried out at a second angle of incidence β of 90° relative to the surface of the substrate, so that now the tops and the areas between the conductor tracks are completely coated.

A thin layer semiconductor is applied as the second layer. For example, a layer sequence of copper, indium, gallium and selenium is applied for a Cu—In—Ga-selenide semiconductor, whereas amorphous silicon is applied for an Si-semiconductor. However, other materials can also be used to make the semiconductor layer.

The individual layers for creating the layer sequence of the entire semiconductor layer are preferably all applied at the same angle of 90° relative to the surface of the substrate, whereby the layer depositions can be alternately interrupted by various other process steps. The resultant layer thickness depends on the semiconductor employed and on its absorption coefficient for solar radiation. Typical semiconductor thicknesses in the realm of the thin layer voltaics are in the order of magnitude of 200 nm to 5 µm.

If the second coating is carried out at an angle different from 90° relative to the surface of the substrate, then the flanks of the conductor tracks are also coated. This has to be avoided for a serial connection of the thin layers since the layer of the front contact, which is to be applied later, must not touch the back contact of the first layer, and a connection via the coating of the flanks would cause a short circuit. However, if the flanks are nevertheless coated, then they have to be cleaned before the application of the subsequent front contact. The cleaning can be done between the application of the individual layers and the further process steps or else after the completion of the second layer. Etching methods and/or mechanical methods, for example, can be used for the cleaning.

After the application of the thin layer semiconductor, further process steps are needed to create a p/n transition. For this purpose, in an especially preferred embodiment of the invention, a cadmium-sulfate layer is applied. The application can be done, for example, by the process of chemical bath deposition. This layer is not shown in the drawings of FIGS. 1 through 5.

Figure 4:
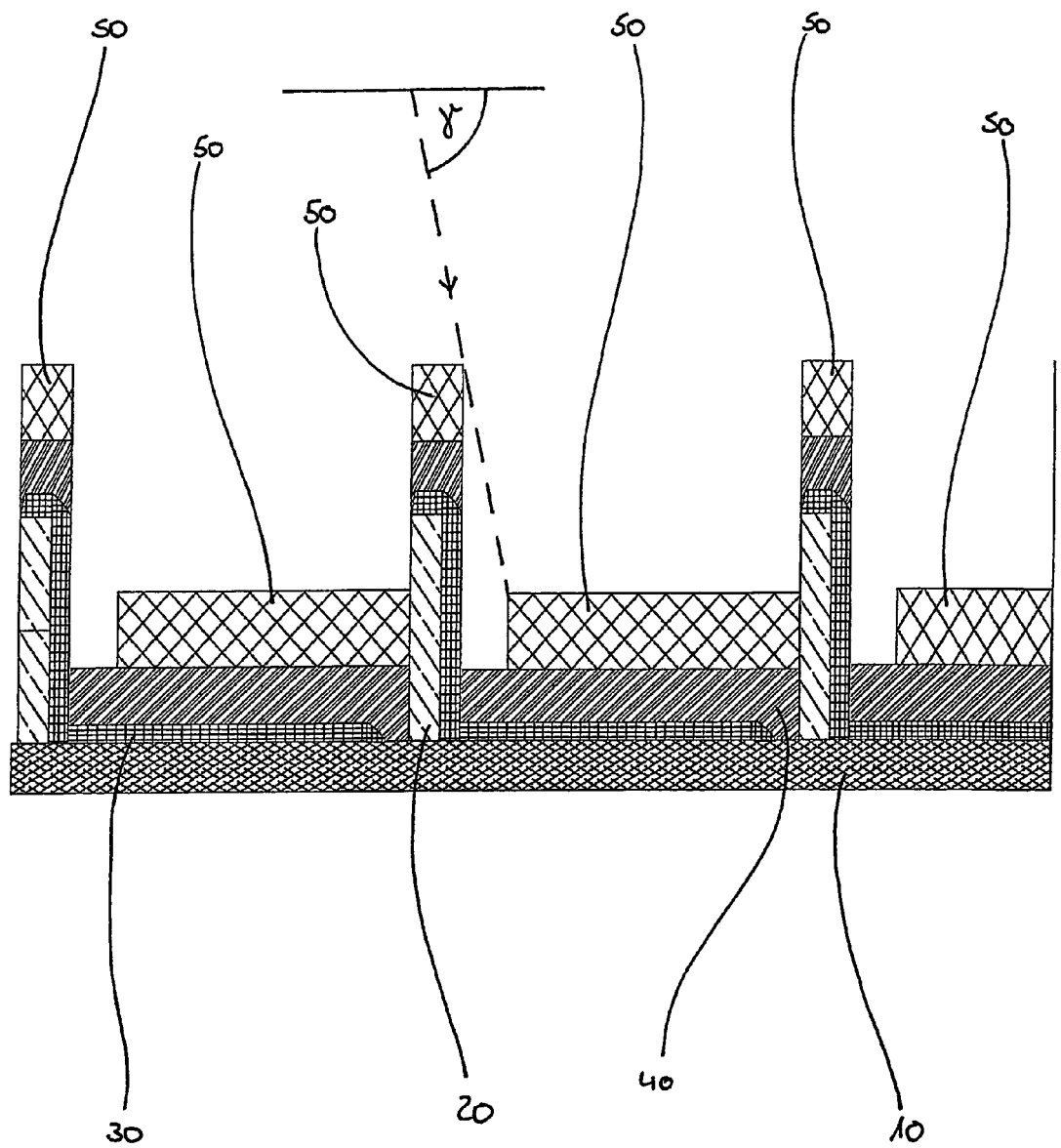
FIG. 4 the application of a third layer at an angle of incidence γ.

The drawing in FIG. 4 shows the subsequent process step of applying a third main layer 50 at an angle of incidence γ. Here, the coating is preferably carried out inversely to the first coating angle α. This third layer can be, for example, an electrically transparent front contact made of materials such as indium-doped tin oxide (ITO), ZnO:Al, gold or silver.

Figure 5:
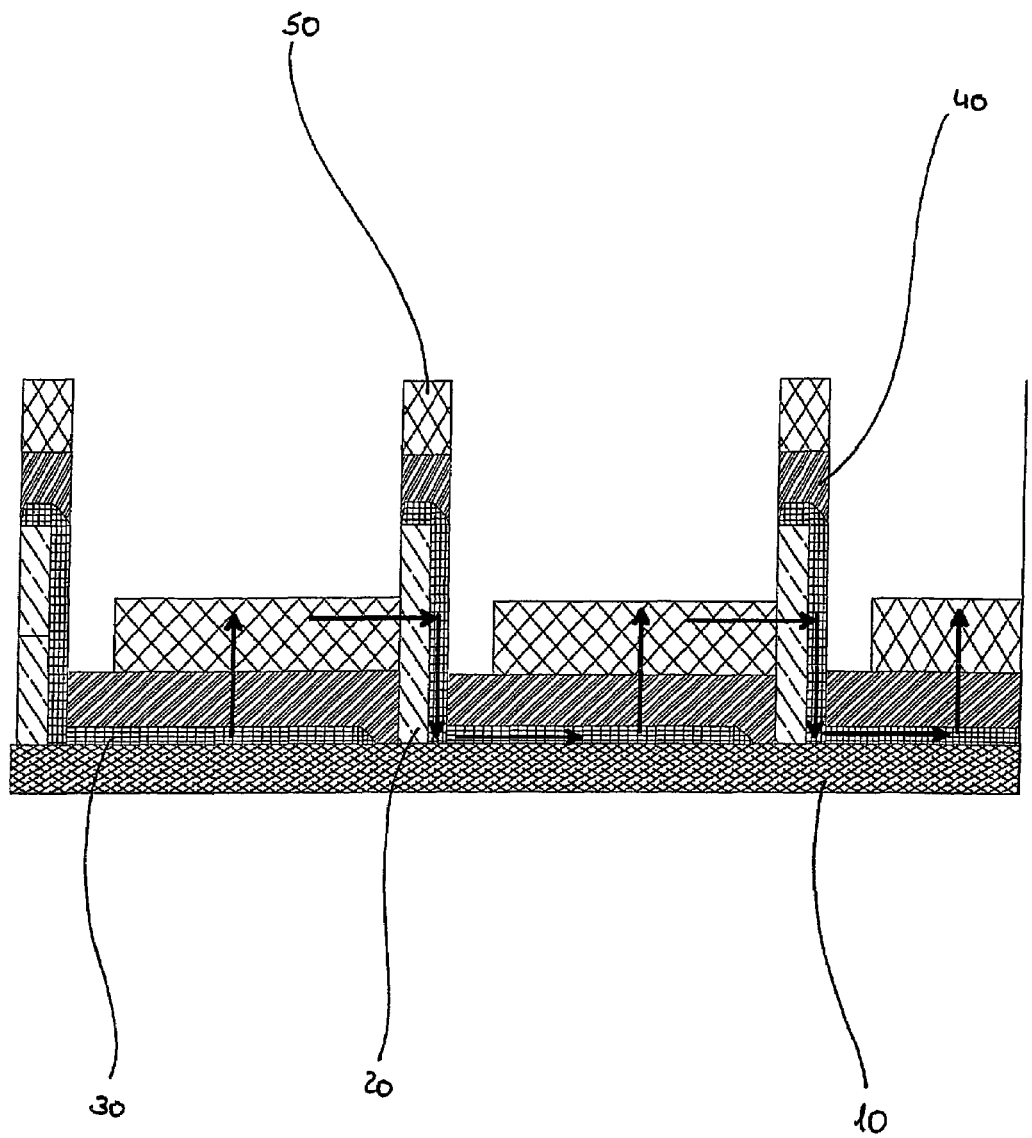
FIG. 5 the current course in the resultant serial connection of the thin layers.

The application according to the invention of the various layers gives rise to a serial connection of thin layers as shown in FIG. 5. In the drawing, a set of arrows shows the resulting current course. The current is conducted through the substrate 10 into the back contact 30 and via the layer 40 into the front contact 50. From there, it flows once again through a conductor track 20 into the back contact and from there, again via the front contact, into the next conductor track.

The invention claimed is:

1. A method for the production of self-adjusting serial connections of thin layers, the method comprising applying electrically conductive conductor tracks onto a substrate, whereby the electrically conductive conductor tracks run essentially parallel to each other; and applying several deposition layers of conductive, semiconductive and/or insulating materials onto the substrate (10), whereby the application of the deposition layers is carried out at different angles of incidence relative to the surface of the substrate, characterized in that after applying the conductor tracks onto the substrate, at least: a first main layer deposition is carried out at a first angle of incidence α relative to the surface of the substrate, whereby a coating is created on tops and flanks of the conductor tracks that are exposed to deposition, and shaded areas are formed behind the conductor tracks, and these shaded areas are thus not exposed to any deposition; a second main layer deposition at a second angle of incidence β is carried out, wherein the angle β is 90° or different from 90°, wherein if angle β is different from 90°, the flanks of the conductor tracks are cleaned, so that only the tops and areas between the conductor tracks are coated; and a third main layer deposition at a third angle of incidence γ is carried out, and the angle γ is inverse to the angle α, whereby in order to form the first, second and third deposition layers, the flux direction of the applied material particles runs perpendicular to the orientation of the conductor tracks.

2. The method according to claim 1, characterized in that the electrically conductive conductor tracks are applied by means of silk screen printing.

3. The method according to claim 1, characterized in that graphite and/or silver paste is used to apply the electrically conductive conductor tracks by means of silk screen printing.

4. The method according to claim 1, characterized in that the electrically conductive conductor tracks are glued onto the substrate by means of a conductive adhesive.

5. The method according to claim 1, characterized in that the targeted application of the deposition layers is carried out at an angle by means of a PVD process.

6. The method according to claim 1, characterized in that at least one of the first, second and third main layers is made up of different individual layers, whereby the individual layers are applied at the same angle as the layer in question.

7. The method according to claim 1, characterized in that the application of the first, second and third main layers and/or their individual layers is interrupted by additional process steps.

8. The method according to claim 1, characterized in that angle β different from 90° and the flanks of the conductor tracks are cleaned by means of etching methods.

9. The method according to claim 1, characterized in that angle β different from 90° and the flanks of the conductor tracks are cleaned mechanically.

10. A self-adjusting serial connection of thin layers, characterized in that the self-adjusting serial connection was produced with the method described by claim 1 and that a first main deposition layer forms a back contact, a second main deposition layer forms a thin layer semiconductor and third main deposition layer forms an electrically transparent front contact.

11. The serial connection of thin layers according to claim 10, characterized in that the substrate is made of glass.

12. The serial connection of thin layers according to claim 10, characterized in that the substrate is made of float glass.

13. The serial connection of thin layers according to claim 10, characterized in that the substrate is made of polymer film.

14. The serial connection according to claim 10, characterized in that the dimensions of the electrically conductive conductor tracks are about length L=30 cm to 6 meters, height H=5 μm to 500 μm and width W=10 μm to 500 μm.

15. The serial connection according to claim 10, characterized in that there are 50 to 200 conductor tracks per meter on the surface of the substrate.

16. The serial connection according to claim 10, characterized in that the conductor tracks are made of conductive polymer compounds or conductive glass frits.

17. The serial connection according to claim 10, characterized in that the main component of the first deposition layer is selected from the group consisting of molybdenum, conductive adhesives, silver or TCOs (transparent conductive oxides).

18. The serial connection according to claim 10, characterized in that the main component of the first deposition layer is ZnO:Al and/or indium-doped tin oxide (ITO).

19. The serial connection according to claim 10, characterized in that the second deposition layer is made up of a layer sequence of copper, indium, gallium and selenium.

20. The serial connection according to claim 10, characterized in that the main component of the second deposition layer is amorphous silicon.

21. The serial connection according to claim 10, characterized in that the main component of the third deposition layer is indium-doped tin oxide, ZnO:Al, gold or silver.

* * * * *